(12) United States Patent
Hong et al.

(10) Patent No.: US 9,396,773 B2
(45) Date of Patent: Jul. 19, 2016

(54) SEMICONDUCTOR DEVICE

(71) Applicant: SK hynix Inc., Incheon-si Gyeonggi-do (KR)

(72) Inventors: Duck Hwa Hong, Seoul (KR); Sang Il Park, Suwon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/520,435

(22) Filed: Oct. 22, 2014

(65) Prior Publication Data
US 2015/0380060 A1    Dec. 31, 2015

(30) Foreign Application Priority Data

Jun. 26, 2014  (KR) ........................ 10-2014-0078885

(51) Int. Cl.
| | | |
|---|---|---|
| *G11C 7/10* | (2006.01) | |
| *G11C 11/4097* | (2006.01) | |
| *G11C 11/4099* | (2006.01) | |
| G11C 7/14 | (2006.01) | |
| G11C 7/12 | (2006.01) | |
| G11C 7/18 | (2006.01) | |

(52) U.S. Cl.
CPC .......... *G11C 7/1048* (2013.01); *G11C 11/4097* (2013.01); *G11C 11/4099* (2013.01); *G11C 7/12* (2013.01); *G11C 7/14* (2013.01); *G11C 7/18* (2013.01); *G11C 2207/005* (2013.01)

(58) Field of Classification Search
CPC .......... G11C 7/1048; G11C 7/14; G11C 7/12; G11C 7/18; G11C 11/4097; G11C 11/4099; G11C 2207/005
USPC ............................. 365/51, 200, 210.1, 233.13
See application file for complete search history.

(56) References Cited

U.S. PATENT DOCUMENTS

| | | | | |
|---|---|---|---|---|
| 3,654,610 | A * | 4/1972 | Sander .................... | G11C 29/76 365/200 |
| 4,321,695 | A * | 3/1982 | Redwine .............. | G11C 7/1036 365/185.09 |
| 4,660,179 | A * | 4/1987 | Aoyama .............. | G11C 29/846 365/200 |
| 5,255,227 | A * | 10/1993 | Haeffele .............. | G11C 29/848 365/189.12 |
| 6,044,028 | A * | 3/2000 | Tomohiro ................ | G11C 7/12 365/200 |
| 6,122,194 | A * | 9/2000 | Chung ................. | G11C 29/785 365/185.09 |
| 6,122,207 | A * | 9/2000 | Koshikawa .......... | G11C 29/846 365/200 |
| 6,185,137 | B1 * | 2/2001 | Sato et al. ...................... | 365/200 |
| 6,330,198 | B1 * | 12/2001 | Koshikawa .......... | G11C 29/846 365/200 |
| 6,333,877 | B1 * | 12/2001 | Nagaoka ................ | G11C 29/70 365/154 |
| 6,414,896 | B1 * | 7/2002 | Kim ..................... | G11C 29/808 365/200 |

(Continued)

FOREIGN PATENT DOCUMENTS

KR      1020120087665 A    8/2012

*Primary Examiner* — Vu Le
*Assistant Examiner* — Sung Cho
(74) *Attorney, Agent, or Firm* — William Park & Associates Ltd.

(57) ABSTRACT

A semiconductor device includes a first cell array region disposed adjacent to a second cell array region; a dummy cell region disposed between the first cell array region and the second cell array region, and configured to distinguish the first cell array region from the second cell array region by dummy bit lines; first group segment input/output lines disposed to correspond to the first cell array region when viewed in terms of the dummy bit lines; and second group segment input/output lines disposed to correspond to the second cell array region when viewed in terms of the dummy bit lines.

18 Claims, 5 Drawing Sheets

(56) References Cited

U.S. PATENT DOCUMENTS

| | | | |
|---|---|---|---|
| 6,490,210 B2 * | 12/2002 | Takase | G11C 29/50 365/200 |
| 6,542,422 B1 * | 4/2003 | Furutani | G11C 7/1051 365/189.07 |
| 6,545,933 B2 | 4/2003 | Sekiguchi et al. | |
| 7,002,858 B2 * | 2/2006 | Lee | G11C 11/4097 365/200 |
| 2003/0012066 A1 * | 1/2003 | Poechmueller | G11C 29/808 365/200 |
| 2005/0232035 A1 * | 10/2005 | Miyakawa | G11C 11/22 365/200 |
| 2006/0109715 A1 * | 5/2006 | Lee | G11C 16/10 365/185.17 |
| 2008/0089156 A1 * | 4/2008 | Tohata | G11C 7/14 365/210.1 |
| 2009/0016092 A1 * | 1/2009 | Sato | G11C 5/02 365/51 |
| 2009/0116318 A1 * | 5/2009 | Kuroda | G11C 7/08 365/200 |
| 2010/0097866 A1 * | 4/2010 | Kobayashi | 365/189.07 |

\* cited by examiner

SEMICONDUCTOR DEVICE

CROSS-REFERENCES TO RELATED APPLICATION

The present application claims priority under 35 U.S.C. §119(a) to Korean application number 10-2014-0078885, filed on Jun. 26, 2014, in the Korean Intellectual Property Office, which is incorporated herein by reference in its entirety.

BACKGROUND

1. Technical Field

Various embodiments generally relate to a semiconductor device, and more particularly, to a technology for increasing a net die of semiconductor chips.

2. Related Art

A semiconductor memory device has continuously been developed to increase the degree of integration and an operating speed. In order to increase an operating speed, a so-called synchronous memory device capable of operating in synchronization with a clock provided from an outside of a memory chip has been disclosed.

Recently, as the degree of integration of a semiconductor memory device increases, the number of data input/output lines tends to increase in a geometric progression. If the number of data input/output lines increases, the area of a region where the data input/output lines are disposed increases in proportion to the number of the data input/output lines. Hence, the area of a sub word line driving unit (SWD) that is determined by the number of data input/output lines is increased, and thus, a limitation exists in increasing the number of semiconductor chips per a wafer.

SUMMARY

In an embodiment, a semiconductor device may include a first cell array region disposed adjacent to a second cell array region. The semiconductor device may also include a dummy cell region disposed between the first cell array region and the second cell array region, and configured to distinguish the first cell array region from the second cell array region by dummy bit lines. Further, the semiconductor device may include first group segment input/output lines disposed to correspond to the first cell array region when viewed in terms of the dummy bit lines. In addition, the semiconductor device may include second group segment input/output lines disposed to correspond to the second cell array region when viewed in terms of the dummy bit lines.

In an embodiment, a semiconductor device may include a plurality of cell array regions including a plurality of memory cells. The semiconductor device may also include a dummy cell region disposed between a first cell array region which is any one of the plurality of cell array regions and a second cell array region disposed adjacent to the first cell array region. The dummy cell region may also be configured to distinguish the first cell array region from the second cell array region by dummy bit lines. The semiconductor device may also include first group segment input/output lines disposed to correspond to the first cell array region when viewed in terms of the dummy bit lines. Further, the semiconductor device may include second group segment input/output lines disposed to correspond to the second cell array region when viewed in terms of the dummy bit lines. The semiconductor device may also include a plurality of bit line sense amplifiers configured to amplify data applied from the plurality of cell array regions and data applied from the dummy bit lines.

DETAILED DESCRIPTION

Hereinafter, a semiconductor device will be described below with reference to the accompanying drawings through various embodiments. The various embodiments are directed to a technology of physically separating segment input/output lines, thereby reducing the area of a semiconductor device. Further, the various embodiments are directed to a technology of disposing a segment input/output line (SIO) precharge unit at the edge region of a bank, thereby reducing the area of a sub hole. According to the embodiments, a chip size may be reduced by decreasing a net die penalty, and due to this fact, net die efficiency may be improved.

Figure 1:
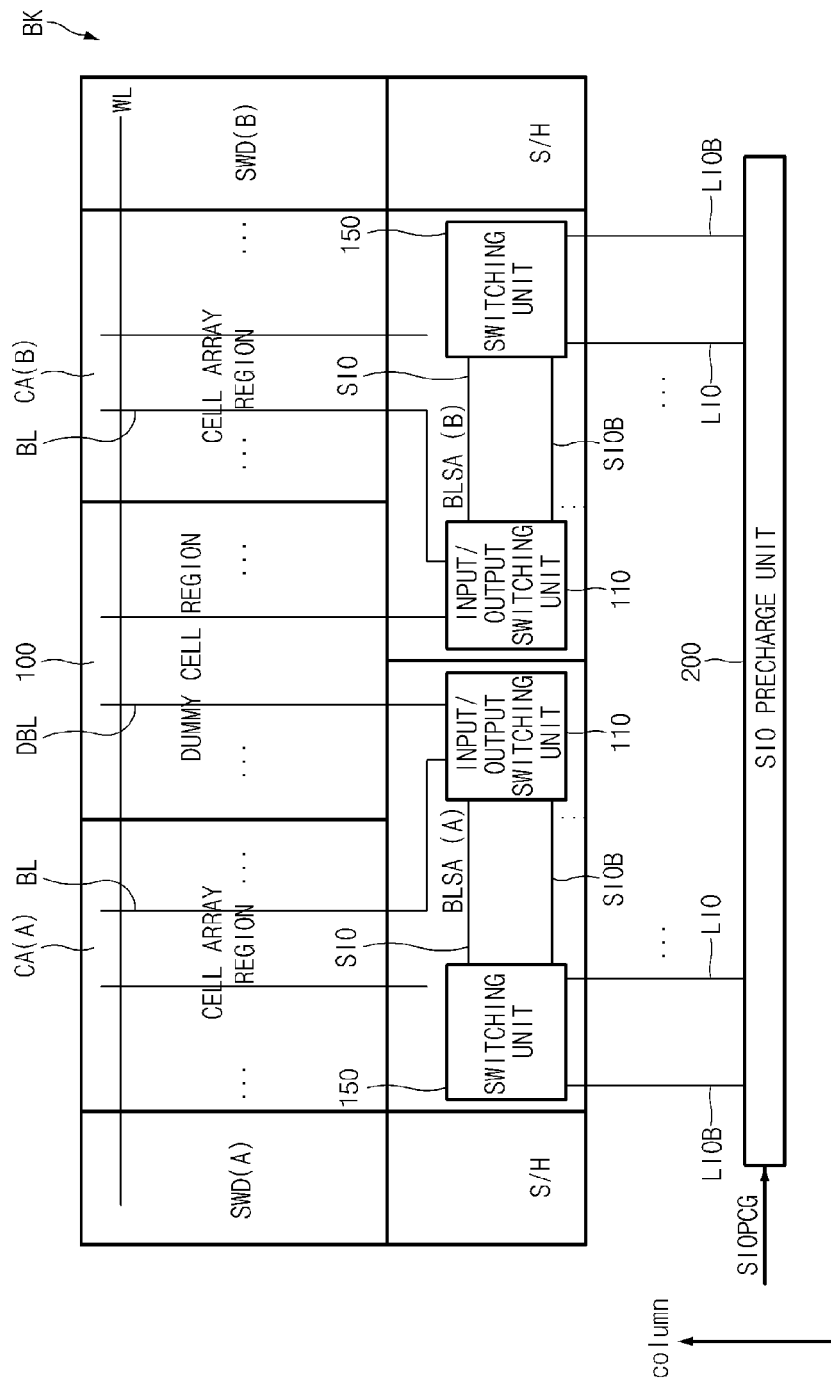
FIG. 1 is a configuration diagram illustrating a representation of an example of a semiconductor device in accordance with an embodiment.

Referring to FIG. 1, a configuration diagram illustrating a representation of an example of a semiconductor device in accordance with an embodiment is shown.

The semiconductor device in accordance with an embodiment includes a plurality of cell array regions CA, a dummy cell region 100, sub word line driving units SWD, bit line sense amplifiers BLSA, input/output switching units 110, switching units 150, sub holes S/H, and a segment input/output line precharge unit 200.

The plurality of cell array regions CA may include pluralities of memory cells, and may select the pluralities of memory cells by the sub word line driving units SWD. The dummy cell region 100 is disposed between a first cell array region CA(A) and a second cell array region CA(B). Among the plurality of cell array regions CA, the first cell array region CA(A) and the second cell array region CA(B), disposed adjacent to each other, are physically separated by the dummy cell region 100.

The dummy cell region 100 is disposed between the first cell array region CA(A) and the second cell array region CA(B). In addition, the dummy cell region 100 includes a plurality of dummy bit lines DBL to physically separate the first cell array region CA(A) and the second cell array region CA(B).

The sub word lines of the first cell array region CA(A) are driven by a first sub word line driving unit SWD(A). Further, the sub word lines of the second cell array region CA(B) are driven by a second sub word line driving unit SWD(B).

The bit line sense amplifiers BLSA are disposed in the row direction of the respective cell array regions CA, and amplify cell data. The bit line sense amplifiers BLSA amplify the data applied from the dummy bit lines DBL of the dummy cell region 100 and the data applied from the first cell array region CA(A) and the second cell array region CA(B).

More specifically, the bit line sense amplifier BLSA(A) is distinguished by the dummy bit lines DBL of the dummy cell region 100 and is disposed to correspond to the bottom of the first cell array region CA(A). The bit line sense amplifier BLSA(B) is distinguished by the dummy bit lines DBL of the dummy cell region 100 and is disposed to correspond to the bottom of the second cell array region CA(B).

While it is illustrated in an embodiment of FIG. 1 that the two bit line sense amplifiers BLSA are disposed on the bottoms of the first cell array region CA(A) and the second cell array region CA(B), it is to be noted that the number of bit line sense amplifiers BLSA may be changed according to the kind (for example, DDR2, DDR3 or LPDDR4) and the prefetch scheme of a semiconductor device.

The sub word line driving units SWD are disposed in the column direction of the respective cell array regions CA. The sub word line driving units SWD also drive the sub word lines which are electrically coupled to the gates of cell transistors.

The input/output switching units 110 selectively electrically couple bit lines BL of the cell array regions CA, the dummy bit lines DBL of the dummy cell region 100 and segment input/output lines SIO and SIOB according to a column select signal YI (which will be described later) (see FIG. 2). The sub holes S/H are disposed at crossing regions where the bit line sense amplifiers BLSA and the sub word line driving units SWD meet.

The bit lines BL of the respective cell array regions CA and the dummy bit lines DBL of the dummy cell region 100 are electrically coupled with the segment input/output lines SIO and SIOB. The segment input/output lines SIO and SIOB are electrically coupled with local input/output lines LIO and LIOB through the switching units 150.

Figure 3:
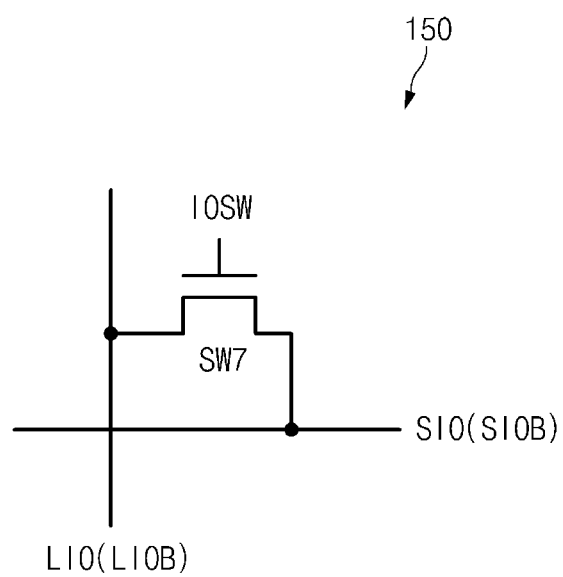
FIG. 3 is a detailed circuit diagram illustrating a representation of an example of the switching unit shown in FIG. 1.

The switching units 150 selectively electrically couple the segment input/output lines SIO and SIOB and the local input/output lines LIO and LIOB in correspondence to a switching signal IOSW (see FIG. 3). The input/output switching units 110 and the switching units 150 may be disposed in the regions of the bit line sense amplifiers BLSA.

In a semiconductor memory device, in particular, a DRAM, a read path to output the data stored in a cell is as follows.

The data of a plurality of cells corresponding to a word line WL selected by a row select signal are amplified by the bit line sense amplifiers BLSA. If the column select signal YI is activated, a cell to be read is selected among the plurality of cells.

The data lines used in the semiconductor memory device may be divided into the segment input/output lines SIO and SIOB, the local input/output lines LIO and LIOB, and a global input/output line (GIO) according to their positions.

The data of the selected cell is outputted by passing through the segment input/output lines SIO and SIOB, the local input/output lines LIO and LIOB and the global input/output line. When the data loaded on the local input/output lines LIO and LIOB is transferred to the global input/output line, the data is amplified once again by a local line amplification circuit. The data loaded on the global input/output line is outputted to an exterior of the semiconductor memory device through a data pad (DQ).

The segment input/output line precharge unit 200 precharges the segment input/output lines SIO and SIOB according to a precharge signal SIOPCG. The segment input/output line precharge unit 200 is formed in the edge region of a bank BK. In other words, the segment input/output line precharge unit 200 is electrically coupled with the local input/output lines LIO and LIOB and disposed under the local input/output lines LIO and LIOB.

In the activated state of the bank BK, the switching units 150 always retain turned-on states in correspondence to the switching signal IOSW. Therefore, in the case where the switching units 150 are turned on, the segment input/output lines SIO and SIOB and the local input/output lines LIO and LIOB are in a state in which they are electrically coupled with each other. According to this fact, if the precharge signal SIOPCG is activated, the segment input/output lines SIO and SIOB are precharged by the segment input/output line precharge unit 200.

In general, a segment input/output line precharge unit is positioned in the region of a sub hole. However, in an embodiment, as the segment input/output line precharge unit 200 is disposed in the edge region of the bank BK, the area of the sub holes S/H may be reduced.

As a semiconductor technology is developed, the number of bits of data to be read from memory cells or to be written in memory cells according to one column operation increases by approximately a factor of two.

As one measure for such an increase in an output bandwidth, a prefetch concept has been introduced. Prefetch is a concept that data are simultaneously read from a plurality of memory cells which configure a unit cell array region, latched and then sequentially outputted. By the prefetch concept, advantages are provided in that a data processing speed may be increased as the number of data to be simultaneously read. More specifically, a prefetch rate is increased.

In a semiconductor device such as an LPDDR4, when referring to a specification, a 16-bit prefetch operation should be realized for a 2K byte page size. To realize the 16-bit prefetch operation, for example, realization of 8 inputs/outputs to and from 512 columns should be possible. Further, to minimize a net die penalty when compared to an existing product, the area of a sub hole should be retained the same. In addition, a cell array region should be physically divided into 2 column units.

To this end, the dummy cell region 100 is inserted between the first cell array region CA(A) and the second cell array region CA(B). Further, the segment input/output line precharge unit 200 is disposed in the edge region of the bank BK.

Figure 2:
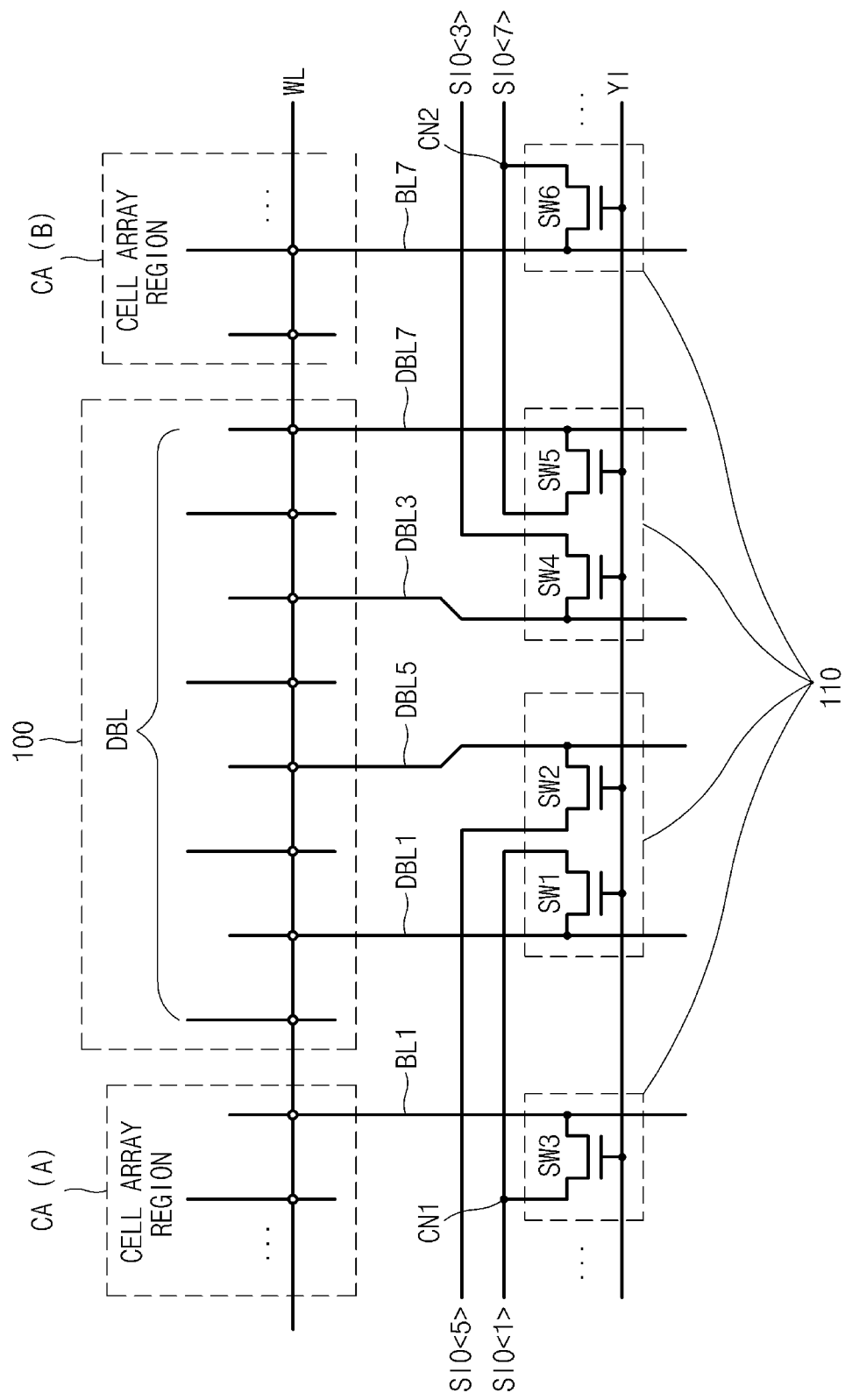
FIG. 2 is a detailed circuit diagram illustrating a representation of an example of the input/output switching units shown in FIG. 1.

Referring to FIG. 2, a detailed circuit diagram illustrating a representation of an example of the input/output switching units 110 shown in FIG. 1 is illustrated.

In an embodiment of FIG. 2, it will be described as an example that odd-numbered bit lines BL and odd-numbered dummy bit lines DBL are electrically coupled with odd-numbered segment input/output lines SIO. FIG. 2 shows an example of disposing bit lines in an open bit line structure.

The first cell array region CA(A) and the second cell array region CA(B) have unit cells in a matrix type. A plurality of word lines WL are disposed in parallel in one direction, that is, the row direction. In addition, a plurality of bit lines BL are disposed in parallel in the other direction, that is, the column direction. The unit cells are disposed at regions where the word lines WL and the bit lines BL cross each other. The dummy cell region 100 forms the same cell pattern as the first cell array region CA(A) and the second cell array region CA(B).

The input/output switching units 110 selectively electrically couple the bit lines (for example, the bit lines BL1 and BL7) of the cell array regions CA, the dummy bit lines (for example, the dummy bit lines DBL1, DBL3, DBL5 and DBL7) of the dummy cell region 100, and the segment input/output lines (for example, the segment input/output lines SIO1, SIO3, SIO5 and SIO7), when the column select signal YI is activated to a high level.

The column select signal YI is a signal generated by a column decoder and is a signal to decode a column address and select corresponding cells of the bank BK.

In an embodiment of FIG. 2, for the sake of convenience in explanation, only two odd-numbered bit lines BL1 and BL7, four odd-numbered dummy bit lines DBL, DBL3, DBL5 and DBL7, and four odd-numbered segment input/output lines SIO1, SIO3, SIO5 and SIO7 are shown. The number of banks BK and the number of input/output lines may be changed according to a design.

The input/output switching units 110 include a plurality of switching elements SW1 to SW6. All of the plurality of switching elements SW1 to SW6 are applied with the column select signal YI through the gate terminals.

The switching element SW1 controls the connection between the dummy bit line DBL1 and the segment input/output line SIO<1>. The switching element SW2 controls the connection between the dummy bit line DBL5 and the segment input/output line SIO<5>. The switching element SW3 controls the connection between the bit line BL1 and the segment input/output line SIO<1>.

Further, the switching element SW4 controls the connection between the dummy bit line DBL3 and the segment input/output line SIO<3>. The switching element SW5 controls the connection between the dummy bit line DBL7 and the segment input/output line SIO<7>. The switching element SW6 controls the connection between the bit line BL7 and the segment input/output line SIO<7>.

Where the dummy cell region 100 is disposed between the first cell array region CA(A) and the second cell array region CA(B), the switching elements SW1, SW2, SW4 and SW5, which are electrically coupled with the dummy bit lines DBL1, DBL3, DBL5 and DBL7, are distinguished and are electrically coupled with the segment input/output lines SIO.

It is assumed that first group segment input/output lines SIO<5> and SIO<1> are electrically coupled with the first cell array region CA(A). In addition, second group segment input/output lines SIO<3> and SIO<7> are electrically coupled with the second cell array region CA(B).

Then, two first group dummy switching elements SW1 and SW2, which are disposed adjacent to the switching element SW3 for the first cell array region CA(A) when viewed in terms of the dummy cell region 100, are electrically coupled with the first group segment input/output lines SIO<1> and SIO<5>. In addition, two second group dummy switching elements SW4 and SW5, disposed adjacent to the switching element SW6 for the second cell array region CA(B) when viewed in terms of the dummy cell region 100, are electrically coupled with the second group segment input/output lines SIO<3> and SIO<7>.

The dummy switching element SW1, disposed adjacent to the switching element SW3 for the first cell array region CA(A), is electrically coupled with the segment input/output line SIO<1> by sharing a contact node CN1 with the switching element SW3. The dummy switching element SW5, which is disposed adjacent to the switching element SW6 for the second cell array region CA(B), is electrically coupled with the segment input/output line SIO<7> by sharing a contact node CN2 with the switching element SW6.

In an LPDDR4 specification, a 16-bit prefetch operation should be performed. Accordingly, to distinguish the segment input/output lines SIO by a specified unit (for example, by the unit of 512 columns) through the dummy bit lines DBL, the contacts of the segment input/output lines SIO should be separated as described above.

As a consequence, an embodiment is configured such that data may be written to screen dummy cells and normal cells.

More specifically, in the case of a test mode, the dummy switching elements SW1, SW2, SW4 and SW5 are turned on by enabling the column select signal YI to the high level. Further, data are written in the dummy cells through the dummy bit lines DBL1, DBL5, DBL3 and DBL7.

When the column select signal YI is enabled to the high level, the switching elements SW3 and SW6 are turned on. Accordingly, screening of a fail when a bridge occurs between a dummy cell and a normal cell becomes possible by reading the data stored in the normal cell.

Referring to FIG. 3, a detailed circuit diagram illustrating a representation of an example of the switching unit 150 shown in FIG. 1 is illustrated.

The switching unit 150 selectively controls the connection between the segment input/output lines SIO and SIOB and the local input/output lines LIO and LIOB in correspondence to the switching signal IOSW. The switching unit 150 includes a switching element SW7. The switching element SW7 is electrically coupled between the segment input/output line SIO and the local input/output line LIO. The switching element SW7 is also applied with the switching signal IOSW through the gate terminal.

Figure 4:
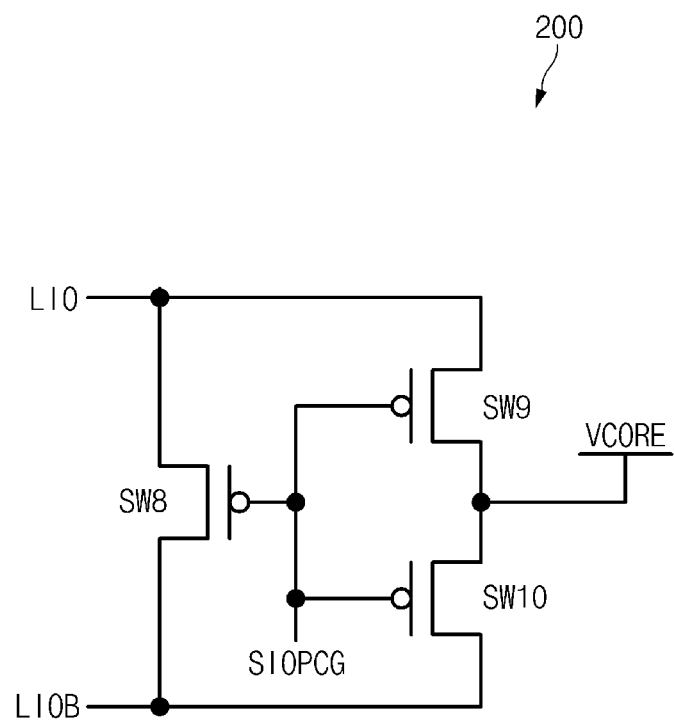
FIG. 4 is a detailed circuit diagram illustrating a representation of an example of the segment input/output line precharge unit shown in FIG. 1.

Referring to FIG. 4, a detailed circuit diagram illustrating a representation of an example of the segment input/output line precharge unit 200 shown in FIG. 1 is illustrated.

The segment input/output line precharge unit 200 precharges the segment input/output lines SIO and SIOB according to the precharge signal SIOPCG.

In other words, the switching unit 150 always retains a turned-on state in correspondence to the switching signal IOSW. Accordingly, in the case where the switching unit 150 is turned on, the segment input/output line SIO and the local input/output line LIO are in a connected state. As a result, the segment input/output line precharge unit 200 may precharge the segment input/output lines SIO and SIOB through the local input/output lines LIO and LIOB when the precharge signal SIOPCG is activated.

The segment input/output line precharge unit 200 includes a plurality of switching elements SW8 to SW10. The plurality of switching elements SW8 to SW10 may include PMOS transistors.

The plurality of switching elements SW8 to SW10 are applied with the precharge signal SIOPCG through the common gate terminals. The switching element SW8 is electrically coupled between the pair of local input/output lines LIO and LIOB. The switching elements SW9 and SW10 are electrically coupled in series between the pair of local input/output lines LIO and LIOB. The switching elements SW9 and SW10 are applied with a core voltage VCORE through a common connection node.

Accordingly, in the segment input/output line precharge unit 200, in the case where the precharge signal SIOPCG is activated to a low level, the plurality of switching elements SW8 to SW10 are turned on. In addition, the pair of local input/output lines LIO and LIOB are precharged to the level of the core voltage VCORE.

Figure 5:
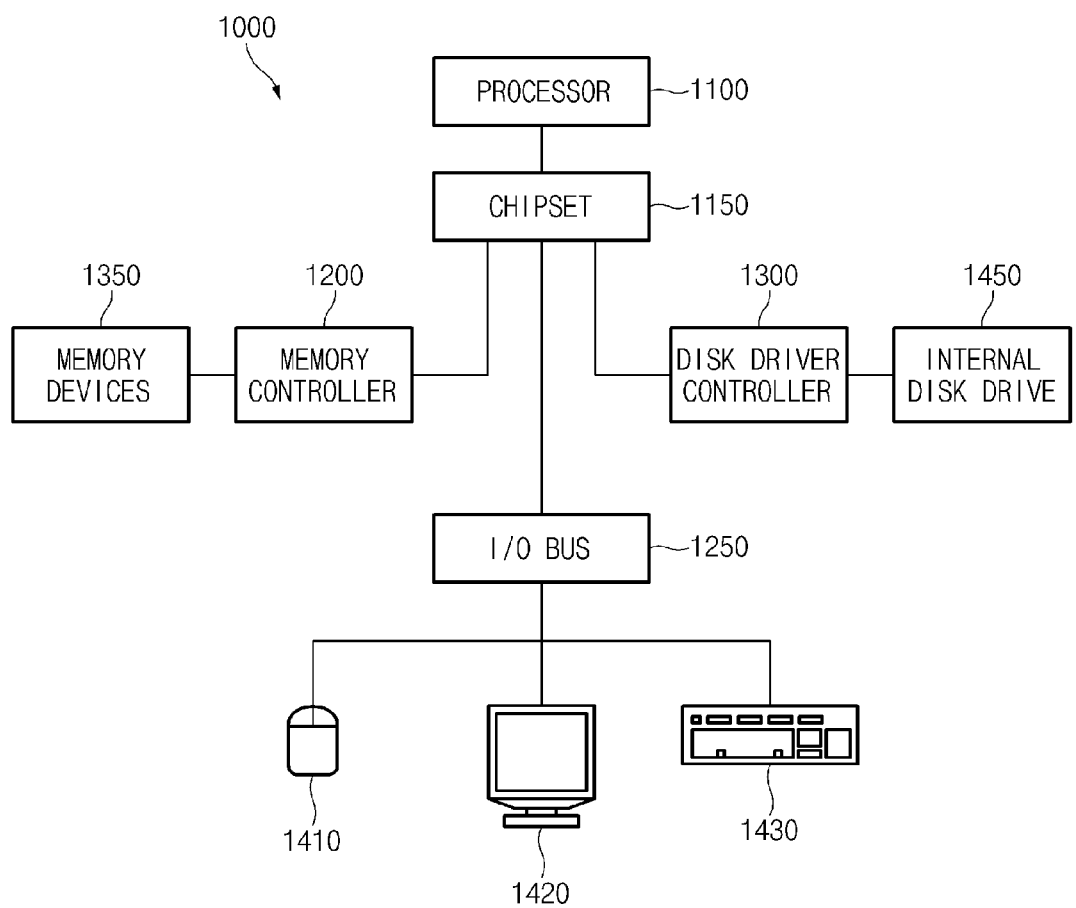
FIG. 5 illustrates a block diagram of a system employing a memory controller circuit in accordance with an embodiment of the invention.

Referring to FIG. 5, a system 1000 may include one or more processors 1100. The processor 1100 may be used individually or in combination with other processors. A chipset 1150 may be operably electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory device 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above descriptions, in the semiconductor device according to an embodiment, the area of a semiconductor chip may be reduced by reducing the area of a sub hole, whereby the number of semiconductor chips per a wafer may be increased.

So far, an embodiment has been described in detail. For reference, embodiments including additional component elements, which are not directly associated with the technical spirit of the embodiment though, may be provided as examples to describe the embodiment in further detail.

Moreover, an active high configuration or an active low configuration for indicating the activated states of signals and circuits may vary depending upon an embodiment. Furthermore, the configurations of transistors may be changed as the occasion demands in order to realize the same function.

While various embodiments have been described above, it will be understood to those skilled in the art that the embodiments described are by way of example only. Accordingly, the semiconductor device described should not be limited based on the described embodiments.

What is claimed is:

1. A semiconductor device comprising:
   a first cell array region disposed adjacent to a second cell array region;
   a dummy cell region disposed between the first cell array region and the second cell array region, and configured to distinguish the first cell array region from the second cell array region by dummy bit lines;
   first group segment input/output lines disposed to correspond to the first cell array region when viewed in terms of the dummy bit lines;
   second group segment input/output lines disposed to correspond to the second cell array region when viewed in terms of the dummy bit lines;
   first input/output switching units electrically coupling a first group of the dummy bit lines and bit lines of the first cell array region with the first group segment input/output lines;
   second input/output switching units electrically coupling a second group of the dummy bit lines and bit lines of the second cell array with the second group segment input/output lines; and
   switching units configured to electrically couple the first group segment input/output lines or the second group segment input/output lines with local input/output lines in response to a switching signal,
   wherein the first input/output switching units and the second input/output switching units configured to switch in response to a same column select signal.

2. The semiconductor device according to claim 1, wherein the first input/output switching units comprise:
   first group dummy switching elements electrically coupled between the dummy bit lines and the first group segment input/output lines and controlled by a column select signal.

3. The semiconductor device according to claim 2, wherein the first input/output switching units further comprise:
   a plurality of switching elements electrically coupled with bit lines of the first cell array region and share contacts of segment input/output lines with the first group dummy switching elements.

4. The semiconductor device according to claim 2, wherein the second input/output switching units comprise:
   second group dummy switching elements electrically coupled between the dummy bit lines and the second group segment input/output lines and are controlled by the column select signal.

5. The semiconductor device according to claim 4, wherein the second input/output switching units further comprise:
   a plurality of switching elements electrically coupled with bit lines of the second cell array region and share contacts of segment input/output lines with the second group dummy switching elements.

6. The semiconductor device according to claim 1, wherein the first input/output switching units and the second input/output switching units are disposed in regions of bit line sense amplifiers.

7. The semiconductor device according to claim 1, wherein the switching units are disposed in regions of bit line sense amplifiers.

8. The semiconductor device according to claim 1, further comprising:
   a segment input/output line precharge unit disposed in an edge region of a bank, and configured to precharge the first group segment input/output lines and the second group segment input/output lines.

9. The semiconductor device according to claim 8, wherein the segment input/output line precharge unit comprises:
   a plurality of switching elements which precharge local input/output lines by a precharge signal.

10. The semiconductor device according to claim 9, wherein the segment input/output line precharge unit comprises:
    a first switching element electrically coupled between a pair of the local input/output lines, and switched by the precharge signal; and
    a second switching element and a third switching element electrically coupled in series between the pair of local input/output lines, and configured to precharge the pair of local input/output lines by the precharge signal.

11. The semiconductor device according to claim 10, wherein the segment input/output line precharge unit precharges the pair of local input/output lines to a level of a core voltage when the precharge signal is activated.

12. The semiconductor device according to claim 8, wherein the segment input/output line precharge unit is disposed under the local input/output lines.

13. A semiconductor device comprising:
    a plurality of cell array regions including a plurality of memory cells;

a dummy cell region disposed between a first cell array region which is any one of the plurality of cell array regions and a second cell array region disposed adjacent to the first cell array region, and configured to distinguish the first cell array region from the second cell array region by dummy bit lines;

first group segment input/output lines disposed to correspond to the first cell array region when viewed in terms of the dummy bit lines;

second group segment input/output lines disposed to correspond to the second cell array region when viewed in terms of the dummy bit lines;

a plurality of bit line sense amplifiers configured to amplify data applied from the plurality of cell array regions and data applied from the dummy bit lines;

first input/output switching units electrically coupling a first group of the dummy bit lines and bit lines of the first cell array region with the first group segment input/output lines;

second input/output switching units electrically coupling a second group of the dummy bit lines and bit lines of the second cell array with the second group segment input/output lines; and switching units configured switching units configured to electrically couple the first group segment input/output lines or the second group segment input/output lines with local input/output lines in response to a switching signal, wherein the first input/output switching units and the second input/output switching units configured to switch in response to a same column select signal.

14. The semiconductor device according to claim 13, wherein the first input/output switching units and the second input/output switching units are disposed in regions of the plurality of bit line sense amplifiers.

15. The semiconductor device according to claim 13, wherein the switching units are disposed in regions of the plurality of bit line sense amplifiers.

16. The semiconductor device according to claim 13, further comprising:

a segment input/output line precharge unit disposed in an edge region of a bank, and configured to precharge the first group segment input/output lines and the second group segment input/output lines.

17. The semiconductor device according to claim 1, wherein the switching units are configured to selectively control connection each between the first group segment input/output lines and a first group local input/output lines, and between the second group segment input/output lines and a second group local input/output lines.

18. The semiconductor device according to claim 13, wherein the switching units are configured to selectively control a connection each between the first group segment input/output lines and a first group local input/output lines, and between the second group segment input/output lines and a second group local input/output lines.

* * * * *